United States Patent [19]
Forgues et al.

[11] Patent Number: 5,708,722
[45] Date of Patent: Jan. 13, 1998

[54] MICROPHONE EXPANSION FOR BACKGROUND NOISE REDUCTION

[75] Inventors: Scott L. Forgues, Tucson, Ariz.; Michael Francon, San Jose, Calif.

[73] Assignee: Lucent Technologies Inc., Murray Hill, N.J.

[21] Appl. No.: 585,969

[22] Filed: Jan. 16, 1996

[51] Int. Cl.$^6$ ...................................... H04B 15/00
[52] U.S. Cl. .................. 381/94; 381/104; 381/106; 381/107; 381/57; 395/2.34; 395/2.35; 395/2.37; 455/50.1
[58] Field of Search .................. 381/94, 106, 107, 381/108, 102, 120, 104, 57; 330/129, 138, 280, 136; 395/2.34, 2.35, 2.36, 2.37, 2.42, 2.55, 2.6; 455/50.1

[56] References Cited

U.S. PATENT DOCUMENTS

| | | | |
|---|---|---|---|
| 3,691,311 | 9/1972 | Wilson | 179/81 B |
| 4,630,304 | 12/1986 | Borth et al. | 381/94 |
| 4,630,305 | 12/1986 | Borth et al. | 381/94 |
| 4,677,389 | 6/1987 | Op de Beek et al. | 330/129 |
| 5,235,637 | 8/1993 | Kraz et al. | 379/387 |

OTHER PUBLICATIONS

AT&T Microelectronics data book, pp. 9–73 through 9–79.

*Primary Examiner*—Curtis Kuntz
*Assistant Examiner*—Duc Nguyen

[57] ABSTRACT

Disclosed is an apparatus for reducing background noise in a telecommunications device, the telecommunications device including a microphone for receiving acoustic sights and generating corresponding electrical signals therefrom, the acoustic signals including voice signals and background noise signals. The apparatus of the present invention in one embodiment include an amplifier having an input for receiving the electrical signals from the microphone and an output, said amplifier operable to receive electrical signals at the first input and provide amplification to the electrical signals to produce amplified electrical signals. The amplifier is further operable to provide amplification at a first gain level and a second gain level, said first gain level exceeding the second gain level. The apparatus also includes a feedback device connected to the output of the amplifier and further operably connected to control the operation of the amplifier. The feedback device is operable to cause the amplifier to provide amplification at the first gain level when the feedback device receives amplified electrical signals at the output having an amplitude above a predetermined threshold and cause the amplifier to provide amplification at the second gain level when the feedback device receives amplified electrical signals at the output having an amplitude below the predetermined threshold.

20 Claims, 4 Drawing Sheets

MICROPHONE EXPANSION FOR BACKGROUND NOISE REDUCTION

FIELD OF THE INVENTION

The present invention relates to the field of telephony, and in particular to controlling background noise reduction based on the detection of an audible voice signal presented to a subscriber set microphone.

BACKGROUND OF THE INVENTION

A problem inherent in telephony is the presence of background noise. Generally, the microphone of a telephone is receptive to both speech signals and to any background noise generated in the environment in which the microphone is located. Not only is background noise annoying to the caller, but the called party is also disturbed by the effect such background noise has on the speech signals received by the called party. In conference calls, each conferee is exposed to the combined background noise of all conferees, and therefore background noise is particularly disturbing.

The problem of background noise for the caller also effects feedback within the subscriber set known as "sidetone". Sidetone is a small portion of the caller's voice signal that is fed back to the telephone's receiver to prevent the phone from sounding "dead" to the caller. Sidetone also allows the speaker to adjust their voice to a desirable level. In this manner, conversations sound normal to the caller, even though one of the caller's ears is blocked from receiving the caller's voice signals through the air. However, when the caller is not speaking, sidetone operates to feedback background noise from the caller's environment which can interfere with the caller's ability to hear the called party's voice signals. Instinctively, the caller may place his/her hand over his/her other ear not placed on the telephone handset to block out the background noise. This technique does not work because sidetone allows the background noise to be transmitted through the receiver of the telephone and into the caller's listening ear.

Various devices and methods have been developed to minimize or eliminate the problems associated with background noise. In U.S. Pat. No. 3,691,311, for example, a telephone set is disclosed in which varying levels of attenuation (or gain) are applied to amplified signals received by the subscriber set's microphone. Specifically, attenuation of the signals is low (high gain) when a voice signal is detected, and attenuation of the signals is high (low gain) in the absence of a voice signal to effectively suppress background noise when the caller is not speaking into the microphone. Another telephone for suppressing background noise when the caller is not speaking is disclosed in U.S. Pat. No. 5,235,637.

Another device, AT&T Corp.'s Universal Voice-Signal Conditioner chip, Part No. LB1068AC/AW ("Conditioner"), is intended for use with commercial speaker phones and accommodates sidetone and suppression of background noise by varying levels of attenuation dependent upon the strength of the microphone signal. The Conditioner includes a variable gain amplifier that provides different levels of gain depending on whether the Conditioner detects the presence of voice signals or background noise.

In AT&T's Conditioner, a detection circuit determines whether an input signal is a speech signal of simply background noise. The input signals are then provided to the variable gain amplifier. The detection circuit sets the gain level of the amplifier. Because the detection circuit operates with the input signal, the detection circuit must preamplify the input signal to levels suitable for detection. To this end, the Conditioner includes a preamplifier in the detection circuit path.

The time the Conditioner takes to switch from a high gain to a low gain, referred to its the attack time, is fourteen milliseconds. While such relatively short attack times are acceptable in commercial speaker phone and other applications, it is possible for speech to be suppressed between syllables of speech. It should be noted that the time it takes a noise suppressor such as AT&T's Conditioner to switch from a low gain to a high gain, referred to as the decay time, is also important. If the decay time is too long, the result is that speech may be muted by unwanted suppression. Thus, it is desirable to provide a noise suppressor having attack and decay times that do not result in speech suppression.

The telephone of U.S. Pat. No. 4,847,897 attempts to eliminate inadvertent speech suppression. U.S. Pat. No. 4,847,897 discloses a telephone having a noise detector, an expander and a variable gain amplifier which provide variable levels of amplification depending on whether speech or mere background noise is detected. The noise detector distinguishes background noise from a speech signal by examining the time-averaged characteristics of the electrical signal emanating from the microphone. The expander, in response to the detection of background noise, reduces the gain of the amplifier, and, in response to the detection of a speech signal, increases the gain of the amplifier. More specifically, the telephone of U.S. Pat. No. 4,847,897 attempts to avoid speech suppression by providing circuitry to compare a short-term average (approximately fifty milliseconds) of the microphone signal to a long-term average (approximately four seconds) of the microphone signal, as it is assumed that speech is usually not continuous for more than four seconds, and breaks in speech usually do not exceed fifty milliseconds. However, like AT&T's Conditioner, noise detection is performed using the microphone signal, before the signal is passed through the variable gain amplifier. Also, the time-averaging technique introduces additional cost to the telephone in addition to expending time in performing the averaging. Therefore, it is desirable to provide a noise suppressor that is inexpensive to manufacture and whose suppression method is efficient and simple to perform.

It is also desired that a noise suppression apparatus be configurable to be able to be used in a variety of environments. For example, the apparatus should be able to suppress noise for commercial telephones, such as commercial speakerphones, in which the background noise may be particularly annoying to the called party. The apparatus should also be applicable for residential telephones, both traditional telephones, and cordless phones. Further, it is desired that the noise suppression apparatus be useful for cellular telephones.

SUMMARY OF THE INVENTION

The present invention provides a microphone expander that provides a gain adjustment depending upon whether voice signals are present. In particular, signals are amplified by a high gain level or a low gain level depending upon the level of a detected microphone signal. The microphone signal is detected after the gain adjustment has occurred, thereby reducing the circuit components required and further providing a hysteresis effect.

A preferred embodiment of the present invention is an apparatus for reducing background noise in a telecommunications device, the telecommunications device including a microphone that receives both voice signals and background noise signals. The microphone is further operable to converting the voice signals and background noise signals into electrical signals. The apparatus includes an amplifier having an input for receiving the electrical signals and an output, said amplifier operable to receive electrical signals at the input and provide amplification to the electrical signals to produce amplified electrical signals. The amplifier is further operable to provide amplification at a first gain level and a second gain level, wherein the first gain level exceeds the second gain level. The apparatus also includes a feedback device connected to the output of the amplifier and further operably connected to control the operation of the amplifier. The feedback device is operable to cause the amplifier to provide amplification at the first gain level when the feedback device receives amplified electrical signals at the output having an amplitude above a predetermined threshold and cause the amplifier to provide amplification at the second gain level when the feedback device receives amplified electrical signals at the output having an amplitude below a predetermined threshold.

The above discussed features, as well as additional features and advantages of the present invention, will become more readily apparent by reference to the following detailed description and the accompanying drawings.

DETAILED DESCRIPTION OF THE DRAWINGS

Figure 1:
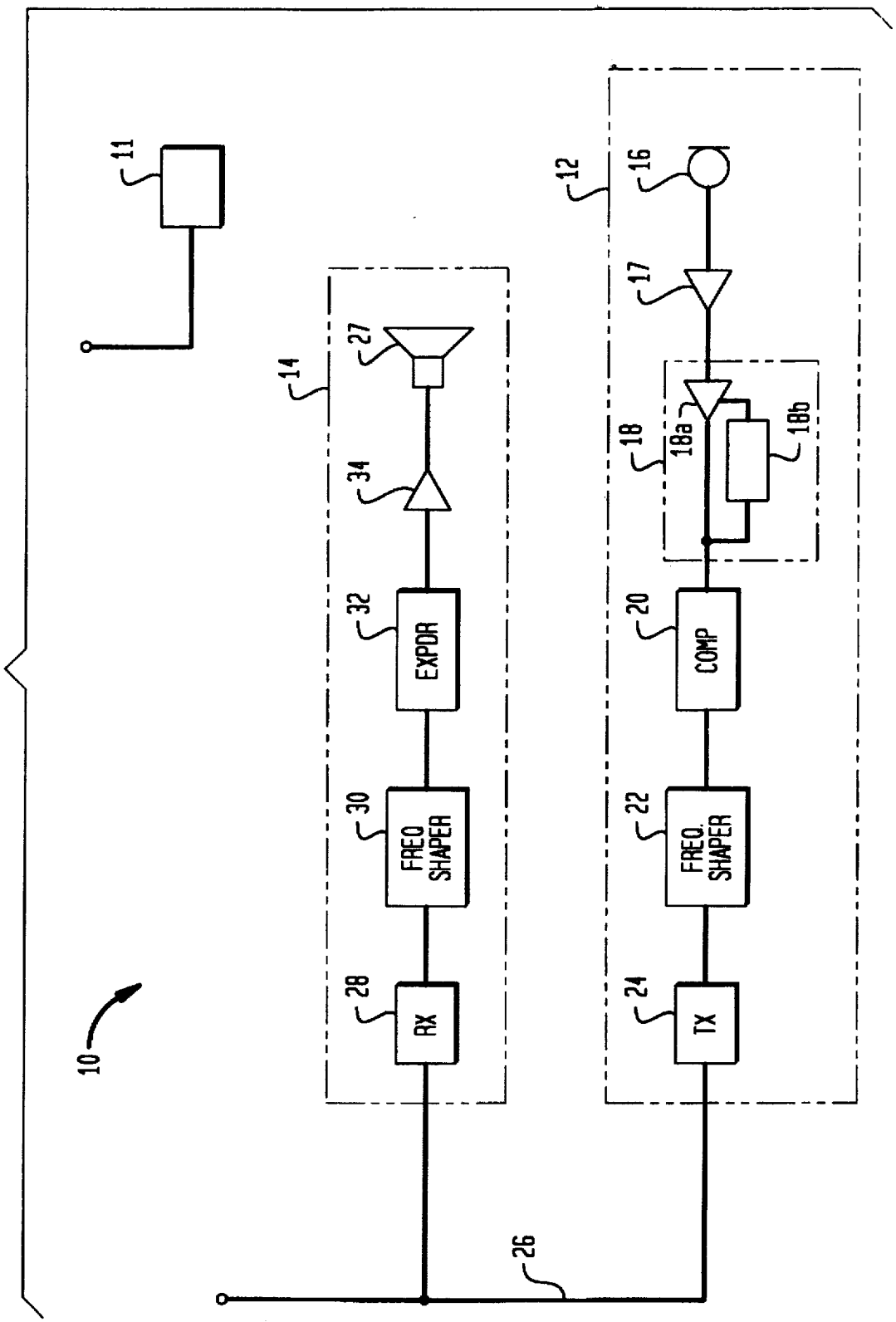
FIG. 1 illustrates a block diagram of an exemplary embodiment of a handset of a telephone according to the present invention.

FIG. 1 shows a block diagram of an exemplary embodiment of a telephone handset 10 according to the present invention. In this embodiment, the telephone handset 10 comprises a cordless telephone handset for use with a telephone base unit 11 and is functionally divided into a microphone portion 12 and a receiver portion 14. The telephone handset 10 includes a conventional microphone 16 for receiving acoustic signals from the caller and any background noise located in the environment, and producing electrical signals therefrom. The electrical signals from the microphone 16 are amplified by an audio amplifier 17 and then provided to a microphone expander 18. The handset 10 is designed to operate in conjunction with the base unit 11, which communicates with the handset 10 via radio frequency or RF signals. The base unit 11 is further connected to a telecommunication network, not shown.

In general, the microphone expander 18 includes an amplifier 18a and a feedback device 18b. The amplifier 18a is a variable gain amplifier that has an input for receiving the electrical signals and an output connected to the compressor 20. The amplifier 18a according to the present invention is operable to receive electrical signals and provide amplification to the received electrical signals at a first gain level and a second gain level, the first gain level exceeding the second gain level. The feedback device 18b is connected to the output of the amplifier and further operably connected to control the operation of the amplifier 18a. Specifically, the feedback device 18b causes the amplifier 18a to provide amplification at the first gain level when the feedback device 18b receives amplified electrical signals at the output having an amplitude substantially above a predetermined threshold. Likewise, the feedback device 18b causes the amplifier 18a to provide amplification at the second gain level when the feedback device receives amplified electrical signals at the output having an amplitude substantially below the predetermined threshold. In a preferred embodiment, discussed in detail below in connection with FIGS. 2 and 3, the feedback device 18b is further operable to cause the amplifier to provide amplification at a third gain level when the feedback device 18b receives amplified electrical signals at the output having an amplitude approximately equivalent to the predetermined threshold.

The amplified electrical signal generated by the microphone expander 18 is then compressed and shaped by a compressor 20 and a frequency shaper 22, respectively, by means and apparatus well known in the art. The compressed, shaped signal is then transmitted from the microphone portion 12 of the handset 10 to the base unit 11 by an RF transmitter 24. The base unit as well known in the art, typically includes an RF receiver, RF transmitter, frequency shaper, audio amplifier and hybrid circuit. The base unit 11 provides the transmitted signal to the telecommunication network, which in turn provides the signal to another telephone, not shown.

The base unit 11 further receives signals from other telephones through the telecommunication network. These signals are transmitted to the receiver portion 14 of the handset 10. The receiver portion 14 is comprised of components well known in the art. Specifically, the receiver portion 14 of the handset 10 includes an antenna 26 and an RF receiver 28 for receipt of the RF signals generated by the base unit 11. The received signal is then shaped and expanded by a frequency shaper 30 and an expander 32, respectively. The shaped and expanded signal in the receiver portion 14 is then provided through an audio amplifier 34 to an earpiece 27 for presentation of audio signals to the caller.

In addition, the caller is able to hear his/her own voice generated by the microphone 16 through sidetone coupling. Signals generated by the caller at the microphone portion 12 are provided to the base unit 11 through the RF transmitter 24 as described above. Circuitry within the base unit 11 couples and transmits a portion of the transmitted signal back to the receiver portion 14, providing sidetone.

Figure 2:
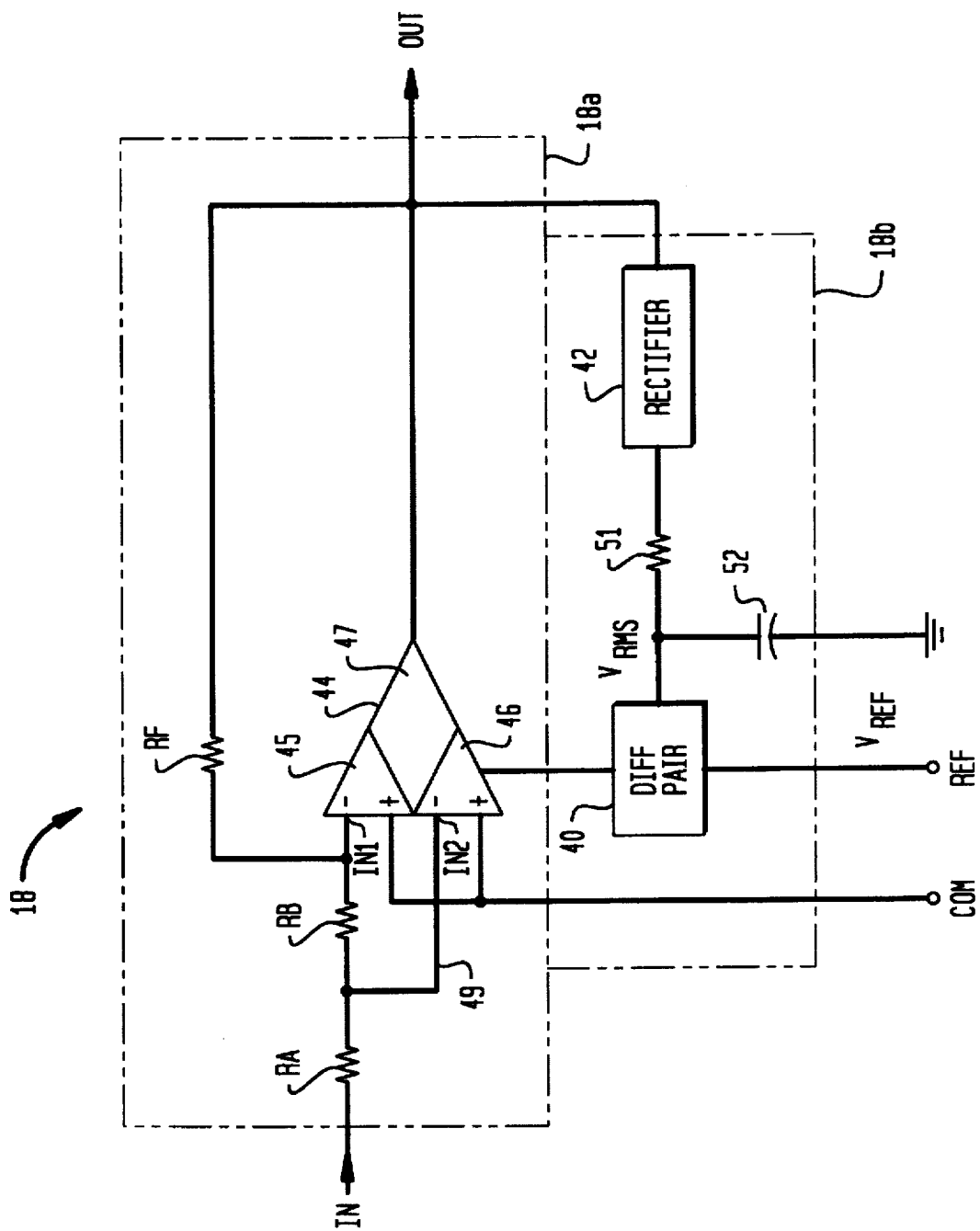
FIG. 2 illustrates a schematic block diagram of an exemplary embodiment of the microphone expander according to the present invention.

Referring now to FIG. 2, there is illustrated a partial schematic diagram of an exemplary embodiment of the microphone expander 18 according to the present invention. The basic elements of the amplifier 18a include resistors RA, RB and RF and an operational amplifier ("op-amp") 44. The feedback device 18b further includes a trigger circuit 40, a low pass filter, and a rectifier 42. The microphone expander 18 also includes an input IN and an output OUT. The op-amp 44 has first and second input stages 45 and 46, respectively, and a common output stage 47. In general, the expander 18 is designed to provide background noise reduction during periods of silence, i.e., when the caller is not speaking into the microphone.

The low pass filter comprises a resistor 51 and a capacitor 52 and is connected between the rectifier 42 and the trigger circuit 40. The trigger circuit 40 in the exemplary embodiment includes two bipolar junction transistors in differential pair configuration ("differential pair"). The trigger circuit 40 is connected to a reference voltage, $V_{REF}$ at input 54 and is operably connected to the op-amp 44 to controllably switch between activation of the first input stage 45 and the second input stage 46 in the manner as will be more fully described below. In other words, the trigger circuit 40 is operably connected to control the gain applied by the microphone expander 18.

The first and second input stages 45 and 46 are each in inverting configuration, sharing the same output stage 47. A feedback resistor RF connects the output OUT to an inverting input IN1 of the first input stage 45. The inverting input IN1 of the first input stage 45 is also connected to a resistor RB, which is in turn connected to the input IN through another serially-connect resistor PA. There is also a line connection 49 between the intersection of the resistors PA and RB and an inverting input IN2 of the second input stage 46. So connected, a first feedback path is defined in this embodiment by RF, and a second feedback path is defined in this embodiment by RF and RB. The gain from the input IN to the output OUT is determined by the ratio of the effective feedback resistance of the feedback path divided by the effective input resistance. Depending on which input stage 45 or 46 is selected by the trigger circuit 40, the gain is set according to the following relationships:

For Low Gain: $G=RF/(RA+RB)$

For High Gain: $G=(RF+RB)/RA$ where $V_{OUT}=V_{IN} G$.

In operation, the microphone expander 18 receives electrical input signals $V_{IN}$ consisting of electrical voice signals from the microphone circuitry at the input IN and produces output signals $V_{OUT}$ consisting of amplified electrical signals at the output OUT. To produce the amplified electrical signals, the microphone expander $V_{OUT}$ amplifies $V_{IN}$ by one of two gain levels, a high gain level or a low gain level. The selection of which gain level is applied is accomplished by the trigger circuit 40, which selectively activates one of the two input stages 45 and 46, or some combination thereof. The op-amp 44 provides a low gain level when the first input stage 45 is inactive and the second input stage 46 is active, and provides a high gain level when the first input stage 45 is active and the second input stage 46 is inactive. In general, the microphone expander 18 provides a high gain level when it detects output signals $V_{OUT}$ at its output that exceed a predetermined threshold, which is indicative of active speech or conversation. By contrast, the expander 18 provides a low gain level when it detects output signals $V_{OUT}$ below the threshold, which is indicative of no speech, or in other words, a pause in a conversation.

The input signals $V_{IN}$ are provided to each of the input stages 45 and 46 at inputs IN1 and IN2, respectively. A suitable bias signal $V_{COM}$ is applied to the noninverting inputs of each of the input stages 45 and 46. The op-amp 44 provides at its output OUT the voice signal amplified by the gain level associated with whichever of the input stages 45 and 46 that is active. According to this embodiment, the high gain level is 6 dB and the low gain level is 0 dB. The 6 dB difference between the high and low gain provides for smoother sounding transitions than is possible with larger gain differences. In particular, if the gain difference is much larger, for example, 20 dB, the transitions between high and low gain may be more noticeable. Moreover, the use of a large gain difference may make it more difficult to differentiate active conversation from noise at the op-amp output OUT. Nevertheless, if the expander 18 is implemented in a speaker phone, a 20 dB gain difference may be more appropriate to achieve a high suppression level.

The amplified electrical signal $V_{OUT}$ at the output OUT is provided as feedback through the rectifier 42, which in the present embodiment is a half-wave rectifier. The low pass filter then smooths the rectified signal to provide a substantially dc voltage level $V_{RMS}$ that is indicative of the amplitude level of signal $V_{OUT}$ provided at the output OUT. The dc voltage level $V_{RMS}$ is applied to the input 53 of the trigger circuit 40 which compares this signal to a reference voltage level $V_{REF}$. In the exemplary embodiment, the half-wave rectifier provides an inverted rectified output, and thus, $V_{RMS}$ is lower (more negative) for higher amplitude $V_{OUT}$ signals. As a result, if $V_{RMS}$ is substantially lower than $V_{REF}$, then $V_{OUT}$ has an amplitude greater than the predetermined threshold and, as a result, the trigger circuit 40 provides a signal on line 56 that causes the first input stage 45 to be active. If, however, $V_{RMS}$ is substantially greater than $V_{REF}$, then the trigger circuit 40 provides a signal to the input 56 of op-amp 44 that causes the first input stage 45 to be inactive and the second input stage 46 to be active. If the level of $V_{RMS}$ is somewhat close to the level of $V_{REF}$, then the trigger circuit 40 causes a combination of the first and second input stages 45 and 46 to be active, which effectively provides a gain level in between the high and low gain levels. In particular, when both the first and second input stages 45 and 46 are active, a portion of $V_{IN}$ receives low gain amplification and a portion of $V_{IN}$ receives high gain amplification, thereby providing an overall gain level between the high and low gain level.

The choice of appropriate $V_{REF}$ and $V_{COM}$ voltage levels will necessarily depend on the particular implementation, including the measured amplitude of output signals for both active speech and background noise input signals. Those of ordinary skill in the art can readily determine the appropriate levels for their implementation.

It should be noted that the use of an inverting rectifier as the rectifier 42 is given by way of example only. Those of ordinary skill in the art may readily employ a noninverting rectifier in which case the trigger circuit 40 would be configured to activate the first input stage 45 when $V_{RMS}$ is greater than $V_{REF}$.

Figure 3:
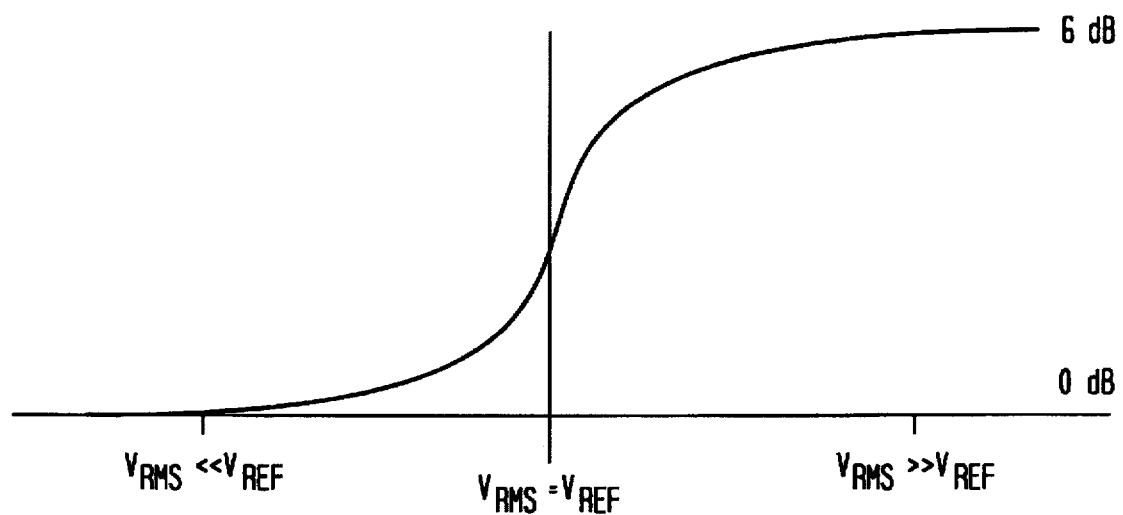
FIG. 3 illustrates a gain relationship of an operational amplifier used in the exemplary microphone expander circuit of FIG. 2.

FIG. 3 shows the gain of the op-amp 44 as a factor of the difference between $V_{RMS}$ and $V_{REF}$. The curve between the point at which $V_{RMS} \ll V_{REF}$ and $V_{RMS} \gg V_{REF}$ allows for a smoother transition between the low and high gain levels. The smooth transition causes less abrupt gain switching that could otherwise cause a telephone conversation to sound choppy. The response shown in FIG. 3 is caused primarily by the output response of the trigger circuit 40 of FIG. 2. The trigger circuit 40 according to an exemplary embodiment described further below in connection with FIG. 4, comprises two bipolar junction transistors commonly connected at their respective emitters. The nature of the response of bipolar junction transistor differential pair typically has the shape illustrated in FIG. 3. In an alternative embodiment, the trigger circuit 40 may suitably have a step response if a smooth transition is not required by the application.

Another advantage of the present invention, not illustrated in FIG. 3, is the hysteresis created by measuring the microphone signal strength at the output of the expander amplifier 18a. Consider a situation in which large amplitude signals indicative of active conversation are being provided to the input IN and the amplifier is providing high gain. Small downward fluctuations or slight reductions in signal strength do not cause activation of the second input stage 46 (and reduce gain) because the slightly reduced signal receives high gain, which maintains $V_{OUT}$ at a high level such that $V_{RMS}$ is sufficiently lower than $V_{REF}$. If a true low amplitude signal is applied to IN, then $V_{RMS}$ does rise above $V_{REF}$ and the expander 18 activates the second input stage 46. The hysteresis thus provides improved operation by reducing the number of inadvertent or undesirable transitions between the high and low gain levels.

Also important to any background noise suppression are the attack and decay times for application of noise suppression. In the embodiment of FIGS. 2 and 3, both the decay and attack times are 100 microseconds. The attack and decay times are determined by the time constant of the low pass filter created by the resistor 51 and the capacitor 52. The preferred attack and decay times were determined experimentally using human subjects and obtaining their subjective judgment on the application of various times. It should be noted that the microphone expander 18 of the present invention has attack and decay times that are significantly less than that of the prior art. For example, AT&T's Conditioner, previously described herein, has an attack time of 14 milliseconds and a decay time of 140 milliseconds. Thus, the resolution of the present invention is much finer than that of the prior art, likely resulting in many more occurrences of background noise suppression in a given speech pattern than in the prior art. The quick responsiveness results in fewer instances of unwanted speech suppression.

Figure 4:
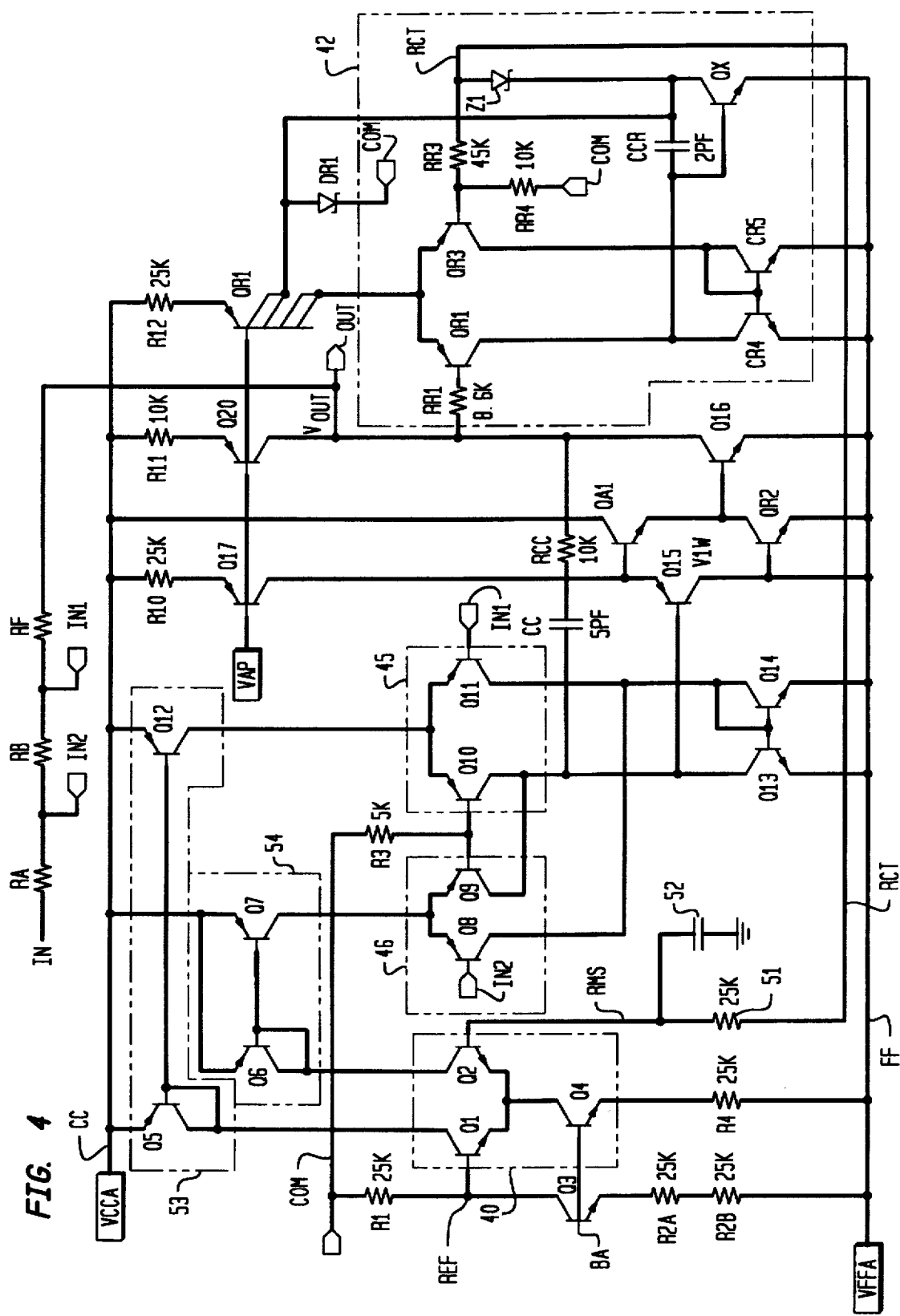
FIG. 4 illustrates in further detail a schematic diagram of the exemplary microphone expander of FIG. 2.

FIG. 4 shows in further detail a first embodiment of the microphone expander 18 operating according to the present invention. Where appropriate, reference numbers used in FIG. 2 will also be used to identify the corresponding circuit elements in FIG. 4. Unless otherwise specified, any transistors referenced herebelow are bipolar junction transistors, each which having a base, collector and emitter as is known in the art. The elements shown in FIG. 4 may suitably be integrated onto single semiconductor substrate. In an alternative embodiment, however, the feedback resistors RA, RB and RF are not integrated onto the substrate, but rather are externally connected in order to allow gain level adjustment by circuit designers.

In addition to the circuit elements described below, the expander 18 also includes voltage bias points CC, FF (ground), COM, and BA, signal points IN1, IN2, RCT, RMS, and REF. The expander 18 as illustrated in FIG. 4 also includes first and second current mirrors 53 and 54. In a semiconductor implementation of the expander, the bias point voltages are all externally provided directly or indirectly through, for example, pin connections. In the following description, the voltage of any bias point or signal point is represented as Vx wherein x is the reference used to identify the bias point or signal point. For example, $V_{COM}$ represents the voltage at the point COM.

The trigger circuit 40 comprises transistors Q1 and Q2 commonly connected at their respective emitters. The trigger circuit 40 further includes another transistor Q4, the collector of which is connected to emitters of the transistors Q1 and Q2. The emitter of Q4 is connected to ground. The base of the transistor Q1 is connected to the point REF.

The point REF is connected to COM through R1, and to FF (ground) through a transistor Q3 and serially connected resistors R2A and R2B. The base of the transistor Q3 is connected to the reference voltage point BA. So connected, the voltage $V_{BA}$ forward biases the transistor Q3, and the resulting voltage drop through the emitter of the transistor Q3 and the resistors R1A and R2A sets the current level through the collector-emitter junction of the transistor Q3. This current level defines the current through the resistor R1, which thereby defines the voltage drop across R1. Accordingly, $V_{REF}$, which is equal to $V_{COM}$ minus the drop over the resistor R1, may be set by altering the value of the resistance R1. For example, by increasing the resistance of R1, the voltage drop across R1 increases, and thus $V_{REF}$ decreases.

In the present embodiment the resistors R1, R2A and R2B are each 25 k ohms. In addition, the voltage drop from the base to emitter of the transistor Q3 is approximately 0.75 volts. Moreover, $V_{COM}$ is approximately 1.8 volts and $V_{BA}$ is approximately 1.0 volt, all of which are provided externally. In this embodiment, then, the current through R2A and R2B, and likewise through R1 is approximately 5 microamps. As a result, $V_{REF}$ is equal to $1.8-(5\times10^{-6})(25\ k)$ or 1.675 volts.

The output of the trigger circuit 40 is the combination of the collectors of the transistors Q1 and Q2. One part of the output, the collector of the transistor Q1 is connected to the first current mirror 53. The other part of the output, the collector of the transistor Q2, is connected to the second current mirror 54. The first current mirror 53 is there after connected to the first input stage 45, and the second current mirror 54 is further connected to the second input stage 46.

In further detail, the first current mirror 53 consists of two PNP transistors Q5 and Q12, the emitters of which are connected to CC, and the bases of which are connected to each other. The collector of the transistor Q5 is connected to the differential pair output, and in particular, the collector of the transistor Q1. The base and collector of the transistor Q5 are further connected to each other. The second current mirror 54 also consists of two PNP transistors Q6 and Q7, the emitters of which are also connected to the bias point CC and the bases of which are connected to each other. The base and collector of the transistor Q6 are further connected to each other. In addition, the collector of the transistor Q4 is connected to the output of the trigger circuit 40, and in particular, to the collector of the transistor Q2.

The first input stage 54 consists of two transistors Q10 and Q11 connected in differential pair form, with one differential pair input, the base of the transistor Q10, forming the non-inverting input and the other differential pair input, the base of the transistor Q11, forming the inverting input. The non-inverting input is connected to COM and the inverting input is connected to IN1. The second input stage 46 includes two transistors Q8 and Q9 configured in an analogous manner as the first input stage 45, except that the inverting input of the second input stage is connected to IN2. The first and second input stages 45 and 46 each have outputs connected to the op-amp output stage 47.

The rectifier 42 in the present embodiment has the following structure. The rectifier includes a differential pair of PNP transistors QR2 and QR3, the emitters of which are connected to each other. The base of the transistor QR2 is connected to OUT through a resistor RR1. The base of QR3 is connected to COM through a resistor RR4, and RCT through a resistor RR3. The collectors of QR2 and QR3 are each connected to an input of a current mirror consisting of two NPN transistors QR4 and QR5. The collector of the transistor QR2 is further connected to the base of an NPN transistor QX. The emitter of the transistor QX is connected to ground FF and the collector of the transistor QX is connected to the anode of zener diode Z1. A capacitor CCR is also connected between the base and collector of the transistor QX. The cathode of the zener diode Z1 is connected to RCT. The emitters of QR2 and QR3 are connected to each other and to an emitter of a biasing transistor QR1.

In a preferred embodiment of the present invention, the resistor RR1 is an 8.6 k ohm resistor, the resistor RR3 is a 45 k ohm resistor, and the resistor RR4 is a 10 k ohm resistor. The capacitor CCR is a 2 pf capacitor.

In operation, the rectifier 42 receives the output signal $V_{OUT}$ of the op-amp, and produces a rectified version thereof at its output, which is the point $V_{RCT}$. The rectified output signal in this embodiment consists essentially of the negative cycles of $V_{OUT}$. The low pass filter then smooths the negative cycles into a more or less dc voltage level that represents an average, or more specifically, root-mean-square of the negative cycles of $V_{OUT}$. This root-mean-square voltage, $V_{RMS}$, is then provided to one input of the trigger circuit 40. Then as described above, the trigger circuit 40 activates either the first input stage 45, the second input stage 46, or some fraction of both depending on the difference between $V_{RMS}$ and $V_{REF}$.

In further detail, consider a large output signal $V_{OUT}$, which corresponds to active speech. The large output signal will include large negative swings in voltage in the negative cycles. During these negative swings, QR2 tends to turn on to a greater extent than QR3. As a result, emitter-collector current through QR2 will tend to turn on the transistor QX. Because QX is turned on, large amounts of current pass through the zener diode Z1, and the voltage $V_{RCT}$ is drawn low. Specifically, the current through the zener diode Z1 causes a large voltage drop from COM through the resistors RR3 and RR4, and as a result $V_{RCT}$ is relatively low compared to $V_{COM}$. The low voltage $V_{RCT}$ is then passed through the low pass filter, which produces a low $V_{RMS}$ relative to $V_{COM}$. Because $V_{REF}$ is slightly less than $V_{COM}$, as discussed above, the low $V_{RMS}$ at the base of Q2 will tend to turn off the transistor Q2 and turn on the transistor Q1. Under these conditions, the transistor Q1 causes current to flow through the transistor Q5 and thus through the transistor Q12. The current through the transistor Q12 provides a bias current to the emitters of the transistors Q10 and Q11 which activates the differential input of the first input stage 45. The transistor Q2, however, allows little or no current to flow from the collector of Q6, which tends to turn off both transistors Q6 and Q7. Because the transistor Q7 is turned off, no current flows to the emitters of the transistors Q7 and Q8, which deactivates the input stage 46.

As a result, large signals at the output $V_{OUT}$ having large negative voltage swings tend to activate the first input stage 45. When the first input stage 45 is activated, the input $V_{IN1}$ applied to the inverting input IN1 provides the high gain level, as determined by the resistor RA, RB and RF of FIG. 2. Accordingly, large signals typically associated with active conversation, as opposed to background noise, cause the expander 18 to provide a high gain level from input to output.

In the case of smaller signals at the output OUT, such as may be present when only background noise in present, the transistor QR2 tends to turn on to a lesser extent. Accordingly, the transistor QR3 tends to turn on to a greater extent, which, in turn, causes the current mirror defined by the transistors QR4 and QR5 to pull the voltage at the base of the transistor QX low. Under these conditions, the transistor QX will tend to turn off, or at least, conduct current to a lesser extent. As a result, less current is provided through the zener diode Z1 and the voltage $V_{RCT}$ tends to elevate towards $V_{COM}$. The relatively high $V_{RCT}$ voltage passes through the low pass filter and provides a voltage $V_{RMS}$ which approaches the level of $V_{COM}$. Because $V_{RMS}$ is close to $V_{COM}$ and $V_{REF}$ is slightly less than $V_{COM}$, the voltage $V_{RMS}$ tends to turn on the transistor Q2 and tends to cause the transistor Q1 to turn off. The transistor Q2 allows current to flow from the current mirror 54 which in turn activates the second input stage 46. The transistor Q1, however, allows little or no current to flow from the current mirror 53, which in turn deactivates the first input stage 45. The second input stage 46, as discussed above in connection with FIG. 2, provides a low gain from the input IN2 to the output OUT because of the configuration of the resistors RA, RB and RF of FIG. 2.

It may be preferable to replace the exemplary rectifier circuit 42 and the low pass filter as configured with an alternative means for converting the output signals to a dc voltage level. In particular, a full wave rectifier having a current output summed to a parallel resistor-capacitor circuit may be used instead of the exemplary rectifier 42 and low pass filter illustrated in FIG. 4. An example of a suitable full wave rectifier may be found in many commercially available compander (combined compressor and expander) integrated circuits, such as those manufactured by Motorola and Signetics.

Although the embodiment of FIG. 1 comprises a residential cordless telephone set, it will be appreciated by those of skill in the art that the microphone expander and background noise suppression method of present invention may be used in any telephone set, whether its primary use is intended as residential or commercial. Those of ordinary skill in the art may readily determine the appropriate levels of attenuation and the attack and decay times appropriate for the particular telephone and its intended environment. Once such appropriate levels are determined, the circuit may readily be modified as appropriate.

It will also be appreciated that the microphone expander 18 need not reside in the telephone handset as illustrated in FIG. 1. Although such placement may be preferable for cordless telephones so that the raw microphone signal does not need to be transmitted to the telephone base, there is no requirement that the microphone expander reside in the handset. Further, for telephones having the majority of its electronics located in the base, such as a traditional corded telephone, it is preferable to place the microphone expander 18 in the telephone base. Similarly, all electronics, including the microphone may exist in the telephone handset, such as in a cellular telephone.

It will be further appreciated that the microphone expander of the present invention is inexpensive to manufacture and operates in an efficient manner. Because noise suppression is determined at the output of the expander, no preamplifier is required between the audio amplifier connected to the microphone and the expander, as is required in the prior art. The elimination of the preamplifier not only reduces the cost of the device, but also eliminates a redundant function, as preamplification also occurs within the expanders of the prior art. Further, the response of the device is very efficient as it does not require time averaging of signals received by the microphone.

It will be appreciated that the above embodiments are merely illustrative and that those of ordinary skill in the art may readily envision or develop other embodiments that incorporate the principles of the present invention and fall within the scope and spirit thereof.

We claim:

1. An apparatus for reducing background noise in a telecommunications device, the telecommunications device including a microphone for receiving acoustic signals, the acoustic signals including voice signals and background noise signals, the microphone being further operable to convert the acoustic signals into corresponding electrical signals, the apparatus comprising:

(a) an amplifier having an input for receiving the electrical signals and an output, said amplifier operable to receive the corresponding electrical signals from the microphone at said input and provide amplification of the corresponding electrical signals to produce amplified electrical signals at the output, said output operably connected to a transmitter for transmitting said amplified electrical signals, said amplifier operable to provide amplification at a first gain level and a second gain level, said first gain level exceeding the second gain level; and (b) a feedback device connected to the output of the amplifier and further operably connected to control the operation of the amplifier, the feedback device operable to cause the amplifier to provide amplification at the first gain level when the feedback device receives amplified electrical signals at the output having an amplitude above a predetermined threshold and cause the amplifier to provide amplification at the second gain level when the feedback device receives amplified electrical signals at the output having an amplitude below the predetermined threshold.

2. The apparatus of claim 1 wherein the amplifier further includes a first input stage connected to the input and a second input stage connected to the input and wherein the amplifier provides the first gain level when the first input stage is activated and the second input stage is deactivated and the amplifier provides the second gain level when the second input stage is activated and the first input stage is deactivated.

3. The apparatus of claim 2 wherein the amplifier further comprises an operational amplifier and wherein the output is further connected to the first input stage through a first feedback path and the output is further connected to the second input stage through a second feedback path, and wherein said first feedback path affects the first gain level and the second feedback path affects the second gain level.

4. The apparatus of claim 1 wherein the feedback device includes a means for converting the amplified electrical signals to a dc voltage level, and wherein the feedback device is operable to cause the amplifier to provide amplification at a select one of the first gain level and at the second gain level whether amplified electrical signals are below the predetermined threshold using the dc voltage level and a dc reference voltage level.

5. The apparatus of claim 4 wherein the means for converting the amplified electrical signal to a dc voltage level includes a rectifier and a low pass filter.

6. The apparatus of claim 2 wherein the feedback device includes a means for converting the amplified electrical signals to a dc voltage level, and wherein the feedback device is operable to cause the activation of a select one of the first input stage and second input stage using the dc voltage level and a dc reference voltage level.

7. The apparatus of claim 6 wherein the feedback device further includes a trigger circuit operably connected to the first input stage, the second input stage, and the means for converting amplified electrical signals to a dc voltage level, and wherein said trigger circuit controllably and alternatively activates and deactivates the first input stage and the second input stage depending upon whether the dc voltage level exceeds the dc reference voltage level.

8. The apparatus of claim 7 wherein the trigger circuit comprises first and second bipolar junction transistors ("BJTs"), each BJT having a base, a collector and an emitter, and wherein the first BJT emitter is connected to the second BJT emitter, the first BJT base is connected to a dc reference voltage source, and the second BJT base is operably connected to the means for converting amplified electrical signals to a dc voltage level.

9. The apparatus of claim 1 wherein the first gain level exceeds the second gain level by approximately 6 dB.

10. The apparatus of claim 5 wherein said low pass filter comprises a resistor and a capacitor.

11. The apparatus of claim 10 wherein said low pass filter has a time constant of approximately 100 microseconds.

12. The apparatus of claim 3 wherein the operational amplifier and the feedback device are integrated onto a single semiconductor device.

13. The apparatus of claim 1 wherein the amplifier is integrated onto a single semiconductor device.

14. A method of controlling the amplification of electrical signals in a telecommunication device having a microphone, the method comprising:

a) providing electrical signals from the microphone to an amplifier;

b) employing the amplifier to amplify the electrical signals using one of at least two gain levels, the at least two gain levels including a high gain level and a low gain level;

c) providing the amplified electrical signals to a transmitter and to a feedback device;

d) employing the feedback device to determine a relationship between an amplitude of the amplified electrical signals and a predetermined threshold; and e) causing the amplifier to amplify subsequent signals using the high gain level if the amplitude of the amplified electrical signals exceeds the predetermined threshold.

15. The method of claim 14 further comprising a step f) of causing the amplifier to amplify subsequent signals using the low gain level if the predetermined threshold exceeds the amplitude of the amplified electrical signals.

16. The method of claim 15 further comprising a step g) of causing the amplifier to amplify the subsequent signals using a combination of the low gain level and the high gain level if the amplitude of the amplified electrical signals is approximately equivalent to the predetermined threshold.

17. The method of claim 14 wherein the step of determining the relationship between the amplified electrical signals and a predetermined threshold includes:

converting the amplified electrical signals to a dc voltage level indicative of the amplitude of the amplified electrical signals; and comparing the dc voltage level to a dc reference voltage level indicative of the predetermined threshold.

18. An apparatus for reducing background noise in a telecommunications device, the telecommunications device including a microphone for receiving acoustic signals, the acoustic signals including voice signals and background noise signals, the microphone being further operable to convert the acoustic signals into corresponding electrical signals, the apparatus comprising:

(a) an operational amplifier having a first input stage operably connected to receive the electrical signals, a second input stage operably connected to receive the electrical signals, and an output, the operational amplifier operable to provide amplification to the electrical signals to produce amplified electrical signals at the output, said output operably connected to a transmitter for transmitting said amplified electrical signals, the operational amplifier further operable to provide amplification at a first gain level when the first input stage is activated and the second input stage is deactivated, and provide amplification at a second gain level when the second input stage is activated and the first input stage is deactivated;

(b) a rectifier connected to the output of the operational amplifier, the rectifier operable to receive amplified electrical signals and generate rectified signals therefrom;

(c) a low pass filter operably connected to the rectifier to receive the rectified signals and operable to generate a dc voltage level therefrom, the dc voltage level representative of a magnitude of the amplified electrical signals; and (d) a trigger circuit connected to the low pass filter to receive the dc voltage level and further connected to control the activation and deactivation of each of the first input stage and second input stage, and wherein the trigger circuit controllably and alternatively activates and deactivates the first input stage and second input stage depending on whether the dc voltage level exceeds a dc reference voltage level.

19. The apparatus of claim 18 wherein the trigger circuit comprises first and second bipolar junction transistors ("BJTs"), each BJT having a base, a collector and an emitter, and wherein the first BJT emitter is connected to the second BJT emitter, the first BJT base is connected to a dc reverence voltage source, and the second BJT base is operably connected to the low pass filter.

20. An telecommunications device handset operable to reduce background noise, the telecommunications device comprising:

a) a microphone for receiving acoustic signals, the acoustic signals including voice signals and background noise signals, the microphone operable to convert the acoustic signals into corresponding electrical signals;

b) an amplifier having an input for receiving the electrical signals and an output, said amplifier operable to receive the corresponding electrical signals from the microphone at said input and provide amplification of the corresponding electrical signals to produce amplified electrical signals at the output, said amplifier operable to provide amplification at a first gain level and a second gain level, said first gain level exceeding the second gain level;

c) a feedback device connected to the output of the amplifier and further operably connected to control the operation of the amplifier, the feedback device operable to cause the amplifier to provide amplification at the first gain level when the feedback device receives amplified electrical signals at the output having an amplitude above a predetermined threshold and cause the amplifier to provide amplification at the second gain level when the feedback device receives a amplified electrical signals at the output having an amplitude below the predetermined threshold;

d) means for providing the amplified electrical signals to a telecommunication network;

e) means for receiving signals from the telecommunication network; and f) means for presenting the received signals in audio signal form.

* * * * *